(12) United States Patent
Ilkov et al.

(10) Patent No.: US 10,291,194 B2
(45) Date of Patent: May 14, 2019

(54) SYSTEM AND METHOD FOR BIASING AN RF CIRCUIT

(71) Applicant: Infineon Technologies AG, Neubiberg (DE)

(72) Inventors: Nikolay Ilkov, Munich (DE); Andreas Baenisch, Munich (DE); Peter Pfann, Munich (DE); Hans-Dieter Wohlmuth, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/728,264

(22) Filed: Oct. 9, 2017

(65) Prior Publication Data

US 2019/0109574 A1    Apr. 11, 2019

(51) Int. Cl.
| | |
|---|---|
| *H03G 3/30* | (2006.01) |
| *H03F 1/02* | (2006.01) |
| *H03F 1/22* | (2006.01) |
| *H03F 1/56* | (2006.01) |
| *H03F 3/193* | (2006.01) |
| *H03F 3/45* | (2006.01) |
| *H03B 5/12* | (2006.01) |

(52) U.S. Cl.
CPC ......... *H03G 3/3036* (2013.01); *H03B 5/1212* (2013.01); *H03F 1/0205* (2013.01); *H03F 1/223* (2013.01); *H03F 1/565* (2013.01); *H03F 3/193* (2013.01); *H03F 3/45475* (2013.01); *H03F 2200/171* (2013.01); *H03F 2200/18* (2013.01); *H03F 2200/222* (2013.01); *H03F 2200/294* (2013.01); *H03F 2200/387* (2013.01); *H03F 2200/451* (2013.01); *H03F 2200/456* (2013.01); *H03F 2200/534* (2013.01); *H03F 2200/541* (2013.01); *H03F 2200/555* (2013.01)

(58) Field of Classification Search
USPC .............................. 330/277, 285, 296, 311
See application file for complete search history.

(56) References Cited

U.S. PATENT DOCUMENTS

| | | |
|---|---|---|
| 6,362,688 B1 | 3/2002 | Au |
| 6,392,490 B1 | 5/2002 | Gramegna et al. |

(Continued)

OTHER PUBLICATIONS

Chiu, Yun, "On the Operation of CMOS Active-Cascode Gain Stage," Journal of Computer and Communication, 2013, 1, 18-24, Published Online Nov. 2013, 7 pages.

(Continued)

*Primary Examiner* — Hieu P Nguyen
(74) *Attorney, Agent, or Firm* — Slater Matsil, LLP

(57) ABSTRACT

In accordance with an embodiment, a circuit includes: a replica input transistor, a first replica cascode transistor, an active current source, and an active cascode biasing circuit. The active current source is configured to set a current flowing through the first replica cascode transistor and the replica input transistor to a predetermined value by adjusting a voltage of a control node of the replica input transistor; and an active cascode biasing circuit including a first output coupled to the control node of the first replica cascode transistor, and the active cascode biasing circuit configured to set a drain voltage of the replica input transistor to a predetermined voltage by adjusting a voltage of the control node of the first replica cascode transistor.

23 Claims, 8 Drawing Sheets

(56) References Cited

U.S. PATENT DOCUMENTS

| | | | |
|---|---|---|---|
| 6,525,609 | B1 | 2/2003 | Behzad |
| 6,590,456 | B2 | 7/2003 | Yang |
| 7,639,081 | B2 | 12/2009 | Arakali et al. |
| 8,779,859 | B2 * | 7/2014 | Su .......................... H03F 3/193 |
| | | | 330/311 |
| 2012/0032742 | A1 | 2/2012 | Hsieh et al. |
| 2013/0314164 | A1 | 11/2013 | Din et al. |
| 2017/0104458 | A1 | 4/2017 | Cohen et al. |
| 2018/0083578 | A1 * | 3/2018 | Klaren .................... H03F 1/223 |

OTHER PUBLICATIONS

Lo, Ping, "A Fully Differential CMOS Operational Amplifier Implemented with MOS Gain Boosting Technique," Thesis submitted to MIT, May 1996, 84 pages.

Sun, Nancy Y., "A DC Stabilized Fully Differential Amplifier," MIT Library, Sep. 2005, 113 pages.

Yan, Shouli et al., "Low Voltage Analog Circuit Design Techniques: A Tutorial", IEICE Trans. Analog Integrated Circuits and Systems, vol. E00-A, No. 2 Feb. 2000, 17 pages.

Bult, Klaas et al., "A Fast-Settling CMOS Op Amp for SC Circuits with 90-dB DC Gain," IEEE Journal of Solid-State circuits, vol. 25, No. 6, Dec. 1990; pp. 1378-1384.

* cited by examiner

| VDD/mode | High Gain | Low Gain1 | Low Gain2 | Low Gain3 |
|---|---|---|---|---|
| VDD<VDDL | Vds1 | Vds3 | Vds3 | Vds6 |
| VDDL<VDD<VDDH | Vds2 | Vds4 | Vds4 | Vds7 |
| VDD>VDDH | Vds2 | Vds5 | Vds5 | Vds7 |

SYSTEM AND METHOD FOR BIASING AN RF CIRCUIT

TECHNICAL FIELD

The present invention relates generally to an electronic device, and more particularly to a system and method for biasing an RF circuit.

BACKGROUND

Electronic devices used with wireless communication systems, such as cellular phones, GPS receivers, and Wi-Fi enabled notebook and tablet computers, generally contain signal processing systems that have interfaces to the analog world. Such interfaces may include wire line and wireless receivers that receive transmitted power and convert the received power to an analog or digital signal that may be demodulated using analog or digital signal processing techniques. A typical wireless receiver architecture includes a low noise amplifier (LNA) that amplifies very small signals that may be received by an antenna and passes an amplified signal to later amplification and/or signal processing stages. By providing gain at the LNA, subsequent gain processing stages are made insensitive to noise, thereby enabling a lower system noise figure.

An LNA circuit generally contains at least one transistor and an input matching network. The purpose of the input matching network, which may be made of one or more passive devices such as inductors and capacitors, is to provide an impedance match and/or a noise match to a previous stage, such as an antenna, a filter, an RF switch, or other circuit. LNA implementations may also include an output matching network, a bias network, and other circuit structures.

In some wireless application scenarios where a wireless receiver is situated very close to a transmitter, for example, in the case of a Wi-Fi enabled device that operates in close proximity to a wireless router, the RF front-end of the wireless device may be exposed to very high signal levels. Thus, in order to maintain adequate linearity, the LNA may be configured to have variable gain or may be bypassed altogether in high signal environments. The additional complexity of providing a variable gain function to a LNA, however, poses additional challenges with respect to maintaining good noise and distortion performance over various gain settings.

SUMMARY

In accordance with an embodiment, a circuit includes: a replica input transistor, a first replica cascode transistor, an active current source, and an active cascode biasing circuit. The active current source is configured to set a current flowing through the first replica cascode transistor and the replica input transistor to a predetermined value by adjusting a voltage of a control node of the replica input transistor. The active cascode biasing circuit includes a first output coupled to the control node of the first replica cascode transistor, and the active cascode biasing circuit is configured to set a drain voltage of the replica input transistor to a predetermined voltage by adjusting a voltage of the control node of the first replica cascode transistor.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a variable gain low noise amplifier (LNA) and an associated bias generator.

In an embodiment, an RF circuit, such as an LNA having an input transistor and one or more cascode transistors, is biased using a replica bias structure having a corresponding replica input transistor and one or more corresponding replica cascode transistors. A first amplifier is used to set the current in the replica bias structure by controlling a voltage across a resistor in series with the one or more replica cascode transistors that correspond to an inductive load in the RF circuit, and a second amplifier sets a voltage across the replica input transistor by controlling the gate voltage of the one or more replica cascode transistors. While closed loop feedback is used to set the currents and voltages in the replica bias structure itself, the replica bias structure provides bias voltages to the RF circuit in an open loop manner. Accordingly, intermodulation products that fall within the bandwidth of the first and second amplifier do not significantly degrade the linearity of the RF circuit.

In an embodiment, a variable gain LNA circuit provides an adjustable gain by varying an impedance coupled to the gate of the one or more cascode transistors. When a high impedance is coupled to the gate of the one or more cascode transistors, the gain of the LNA is reduced, and when a low impedance is coupled to the gate of the one or more cascode transistors, the gain of the LNA is increased. The gain of the variable gain LNA is further adjusted by providing an inductively coupled feedforward path between an input inductor coupled to the gate of the input transistor and a degeneration inductor coupled to the source of the input transistor. When the inductively coupled feedforward path is activated, the gain of the variable gain LNA is decreased, and when the inductively coupled feedforward path is deactivated, the gain of the variable gain LNA is increased.

Figure 1A:
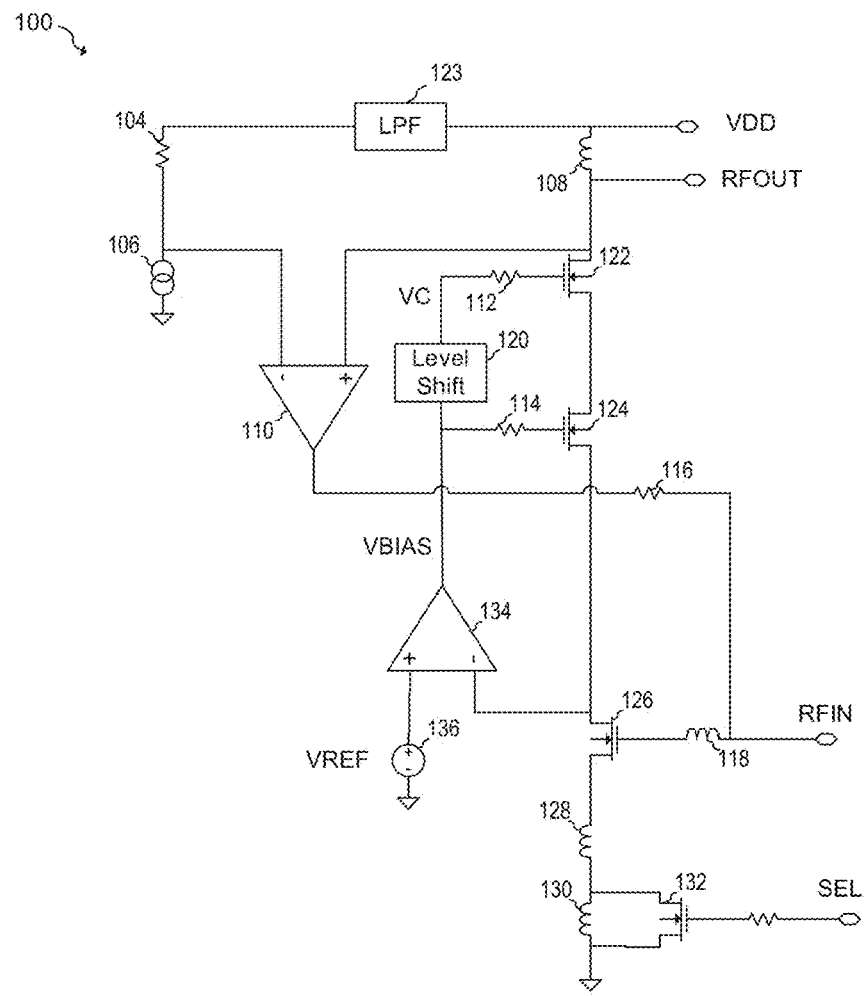
FIG. 1A illustrates a schematic of an exemplary variable gain LNA and an associated bias generator.

FIG. 1A illustrates an exemplary LNA 100 that includes input transistor 126, cascode transistors 122 and 124 coupled in series with input transistor 126, output inductor 108 and degeneration inductors 128 and 130. Inductor 108 may also be referred to as an inductive pullup circuit. Inductor 118 coupled in series with the gate of input transistor 126 provides an RF input match. Input transistor 126 and cascode transistors 122 and 124 may be implemented as shown, using NMOS transistors, or may be implemented using other device types, including, but not limited to, bipolar transistors, and PHEMT transistors. During operation, the gain of LNA 100 can be varied by bypassing degeneration inductor 130 using switching transistor 132. Thus, inductor 130 may also be referred to as a selectable inductor. For example, when degeneration inductor 130 is bypassed using transistor 132, LNA 100 operates in a high gain condition. On the other hand, when transistor 132 is off, LNA 100 operates in the lower gain condition due to the additional impedance of degeneration inductor 130 coupled in series with degeneration inductor 128. In the present disclosure, the channels or primary current paths of the various disclosed NMOS transistors, such as transistors 122, 124, 126 and 132, may be referred to as load paths, and the source/drain terminals of these transistors may be referred to as load path terminals. The primary current paths and terminals connected to the primary current paths may be referred to as load paths and load path terminals in non-NMOS transistors as well.

LNA 100 is biased using amplifiers 110 and 134. The current flowing through transistors 122, 124, and 126 is controlled using an active current source that includes reference current source 106, resistor 104 and amplifier 110. Resistor 116 coupled between the output of amplifier 110 and RF input port RIN is used to prevent the low output impedance of amplifier 110 from loading the input port at high frequencies. During operation, reference current source 106 causes a current to flow through resistor 104. Amplifier 110, which has inputs connected to resistor 104 and inductor 108, adjusts the gate voltage of transistor 126 until the voltage across inductor 108 is substantially equal to the voltage across resistor 104. Thus, if resistor 104 is constructed using a similar material as inductor 108, the current through inductor 108 can be controlled such that it is a scaled version of the current provided by reference current source 106. For example, if inductor 108 is constructed using a particular metal layer on an integrated circuit, and if resistor 104 is constructed using a metal resistor from the same layer as inductor 108, the current through inductor 108 will track the current through resistor 104. According to one specific example, if inductor 108 is built using 100 squares from a first metal layer and resistor 104 is built using 1000 squares from the same first metal layer, the current flowing through inductor 108 is 10 times higher than the current flowing through resistor 104 because resistor 104 has a resistance that is 10 times smaller the resistance of inductor 108.

Lowpass filter 123 coupled between power supply input port VDD and resistor 104 may be used to prevent or attenuate noise on the power supply from modulating the bias current of LNA 1000. In some cases, lowpass filter 123 may improve the power supply rejection ratio (PSRR) of the circuit without the need for additional filtering of the supply voltage in the RF path. In some examples, the use of lowpass filter 123 may obviate the need for using low-dropout voltage regulators that could reduce the output voltage swing and linearity of LNA 100. Lowpass filter 123 may be implemented, for example using lowpass filter structures known in the art including, but not limited to RC filters and LC filters.

The drain-source voltage of transistor 126 is set to voltage VREF produced by the voltage source 136 using amplifier 134. During operation, amplifier 134 amplifies the voltage difference between the voltage VREF and the voltage at the drain of transistor 126, and applies the amplified voltage difference to the gate of cascode transistor 124. Accordingly, the source voltage of transistor 124 is set to approximately VREF in order to reduce the error between the negative and positive input terminals of amplifier 134.

Figure 1B:
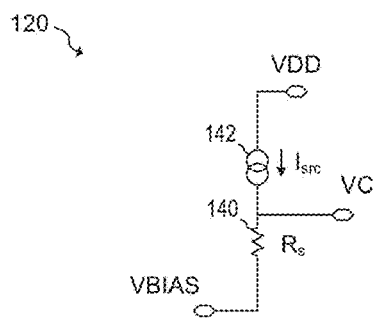
FIG. 1B illustrates a level shifter circuit that may be used in the variable gain LNA of FIG. 1A.

Level shifting circuit 120 is coupled between the gates of transistors 124 and 122 in order to provide a bias voltage for transistor 122. Level shifting circuit 120 may be implemented, for example using a resistor 140 having a resistance $R_S$ coupled in series with constant current source 142 that provides a current $I_{src}$ as shown in FIG. 1B. Using Ohms law, it can be shown that voltage VC=VBIAS+$I_{src}R_S$, where VBIAS is the output voltage of amplifier 134 and VC is the voltage applied to the gate of cascode transistor 122. Alternatively, other level shifting circuits known in the art may be used to implement level shifting circuit 120.

Resistors 112 and 114 are coupled in series with the gates of transistors 122 and 124, respectively, in order to reduce attenuation caused by parasitic gate source capacitance of transistors 122 and 124. In some examples, resistors 112 and 114 have a resistance of about 5 kΩ; however, other values can be used depending on the particular system and its specifications.

In some situations, second order intermodulation distortion products caused by the interaction between two closely spaced RF frequencies and nonlinearities of active devices within LNA may exist at low frequencies and fall within the bandwidth of the current bias loop that includes amplifier 110 and the cascode voltage bias loop that includes amplifier 134 (e.g., about 10 MHz). In some examples, these down-converted intermodulation distortion products present within the bias currents and voltages of LNA 100 may degrade the linearity of the circuit.

Figure 2:
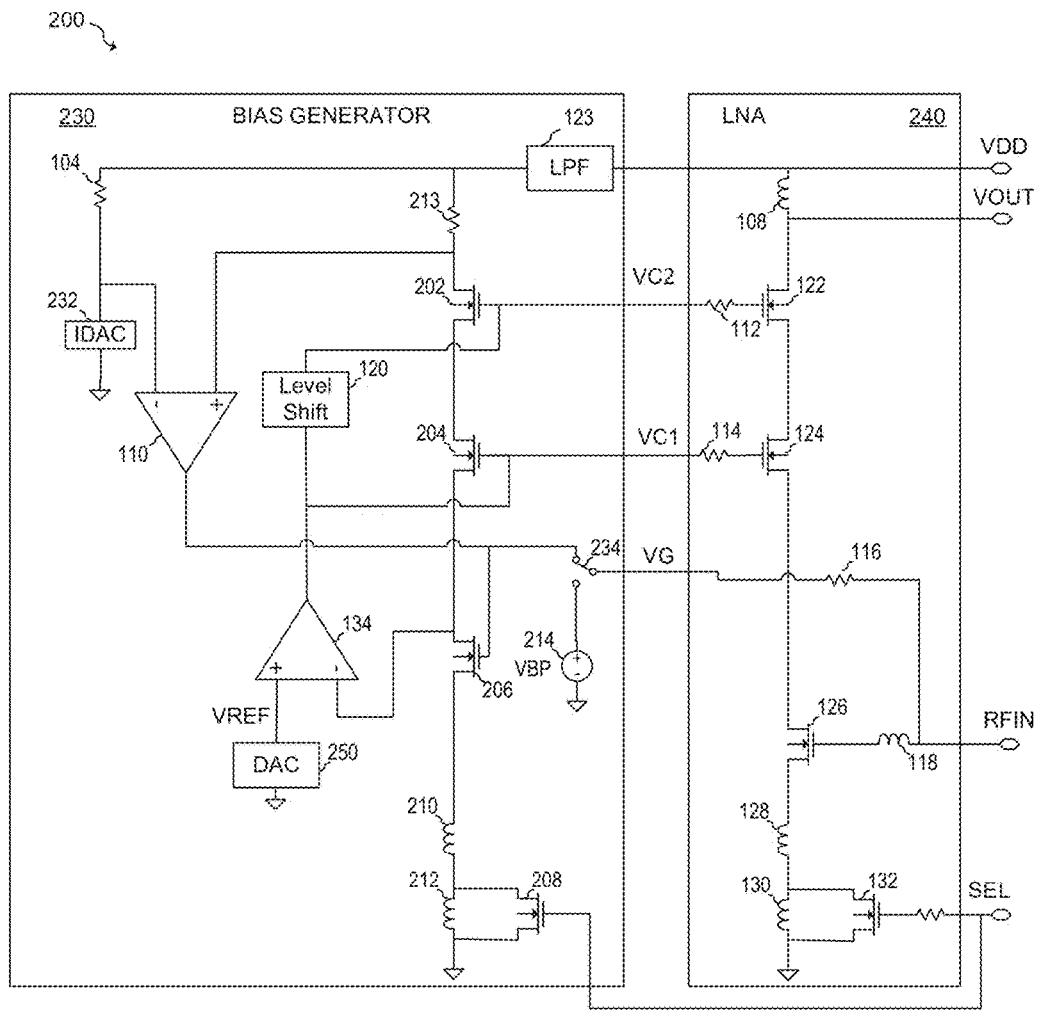
FIG. 2 illustrates a schematic of an embodiment variable gain LNA and an associated bias generator.

FIG. 2 illustrates an RF circuit 200 according to an embodiment of the present invention. As shown, circuit 200 includes bias generator 230 coupled to LNA 240. LNA 240 includes input transistor 126, cascode transistors 122 and 124, output inductor 108, degeneration inductor 128 and selectable degeneration inductor 130 coupled in parallel with transistor 122. The operation of LNA 240 is described above with respect to FIG. 1A. In an embodiment of the present invention, bias generator 230 is constructed using a replica circuit that corresponds to the structure of LNA 240. As shown, bias generator 230 includes replica cascode transistors 202 and 204 that correspond to cascode transistors 122 and 124 in LNA 240. Replica input transistor 206 corresponds to input transistor 126 of LNA 240, replica inductors 210 and 212 and switching transistor 208 correspond to inductors 128 and 130, and transistor 132 in LNA 240 and resistor 213 correspond to load inductor 108 in LNA 240. Replica inductors 210 and 212, as well as switching transistor 208 may also be referred to as a replica degeneration circuit. In alternative embodiments, the replica degeneration circuit may be structured to correspond to the target RF circuit being biased. Thus, embodiment replica degeneration circuits may be different from what is depicted in FIG. 2.

In various embodiments, replica components 213, 202, 204, 206, 210, and 212 are scaled versions of inductor 108, cascode transistors 122 and 124, input transistor 126 and degeneration inductors 128 and 130. By scaling down the size of replica input transistor 206 and replica cascode transistors 202 and 204, power consumed by bias generator 230 can be reduced. In an example, these replica components of bias generator 230 are scaled to operate at a current that is n times smaller than a bias current flowing through LNA 240. In order to accomplish this, the size of replica cascode transistors 202 and 204 and replica input transistor 206 is n times smaller than cascode transistors 122 and 124, and input transistor 126. Similarly, the resistance of resistor 213 and inductors 210 and 212 is n times larger than the resistance of inductors 108, 128 and 130. In one specific example, n is 100; however, it should be understood that a scale of 100 to 1 is just one example of many possible embodiment scaling ratios. In alternative embodiments of the present invention other values for scaling ratio n may be used.

In some embodiments, replica inductors 212 and 210 may be implemented using one or more selectable resistors, where the resistance of the one or more selectable resistors has a same temperature coefficient as a resistance of inductor 128, which may be realized using a selectable inductor. The resistances of the selectable resistors and inductors may be designed to track each other, for example, by implementing the selectable resistor in the same conductive layer as the selectable inductor.

As is apparent in FIG. 2, bias voltages VG, VC1 and VC2 are generated in a closed loop manner using amplifiers 110 and 134 within bias generator 230, but are provided to the gate of input transistor 126, the gate of cascode transistor 124 and the gate of cascode transistor 122 within LNA 240 in an open loop manner. Accordingly, intermodulation distortion products stay local to LNA 240 and are not directly introduced into the current and voltage bias loops of bias generator 230. Such embodiments are, therefore, less prone to performance degradation due to intermodulation distortion products generated within the signal path of the RF circuit that get coupled to the bias generator.

In some embodiments, the voltage across input transistor 126 may be set by varying cascode bias reference voltage VREF using an optional digital-to-analog DAC converter 250. Similarly, the current flowing through LNA 240 may be set using an optional current digital-to-analog converter (IDAC) 232. In some embodiments DAC 250 and IDAC 232 may be used to adapt the bias currents and voltages of LNA 240 according to a particular gain mode and/or for a particular supply voltage. For example, at a highest gain setting, the drain-source voltage of input transistor 126 may be reduced via DAC 250 in order provide for high output swing and linearity. At lower gain settings, the drain-source voltage of input transistor 126 may be increased via DAC 250 in order to increase linearity. Depending on the power supply voltage at input port VDD, the drain-source voltage of input transistor 126 may be further adjusted in order to maximize linearity in situations where more headroom is available. In some embodiments, the bias current of LNA 240 may be reduced when maximum performance is not needed.

Optional switch 234 allows a fixed voltage VBP generated by voltage source 214 to be applied to the gate of transistor 126 to improve the linearity of the circuit when LNA 240 is bypassed. By applying a fixed voltage that turns off transistor 126 in a bypass mode, nonlinearities introduced by changes in the gate-source capacitance of transistor 126 are avoided. In various embodiments, bias generator 230 may bias LNA 240 as illustrated and described above. Alternatively, other types of circuits besides LNAs may be biased using bias generator 230. For example, a VCO may be biased using bias generator 230 as described in connection with FIG. 7.

In various embodiments, RF circuit 200, as well as other RF circuits, bias generator and LNA structures disclosed herein, may be implemented on a semiconductor substrate including, but not limited to a silicon substrate and silicon on insulator substrate. Bias generator and 230 and LNA 240 may be implemented on the same monolithic semiconductor substrate or may be implemented using multiple semiconductor substrates. In some embodiments, RF circuit 200 may be implemented on the same semiconductor substrate as other RF circuitry.

Figure 3A:
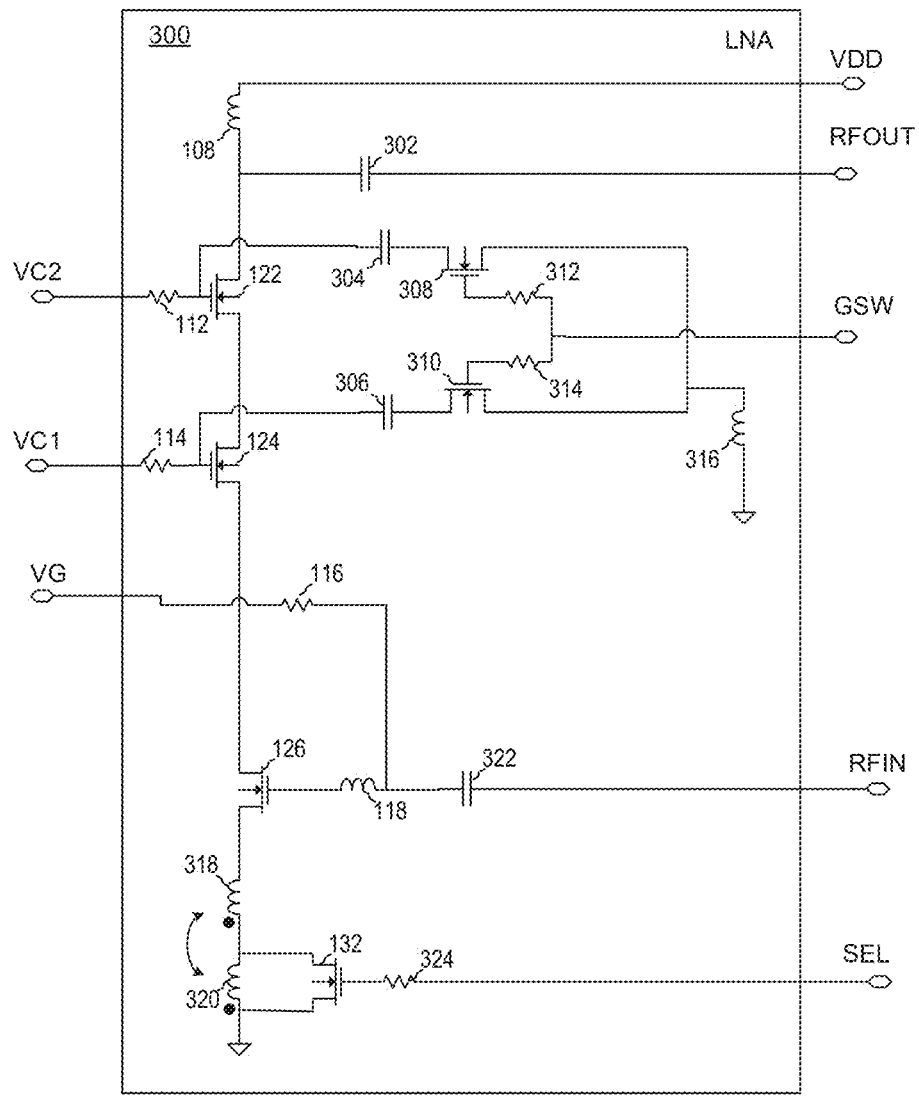
FIG. 3A illustrates a schematic of another embodiment variable gain LNA.

FIG. 3A illustrates an embodiment variable gain LNA 300, according to another embodiment of the present invention. LNA 300 includes cascode transistors 122 and 124, input transistor 126, output inductor 108 and a configurable degeneration circuit that includes mutually coupled inductors 318 and 320. LNA 300 includes an output matching network that is formed by the combination of output inductor 108 and output coupling capacitor 302. The output matching of LNA 300 can be adjusted or fine-tuned by adjusting the inductance of output inductor 108 and/or the capacitance of output coupling capacitor 302. Similarly, LNA 300 includes an input matching network that includes input inductor 118 and input coupling capacitor 322. Accordingly, the input match of LNA 300 can be adjusted or fine-tuned by adjusting the inductance of input inductor 118 and/or the capacitance of input coupling capacitor 322.

In various embodiments, LNA 300 may be biased using bias generator 230 shown in FIG. 2 and described above. Alternatively, other bias generation circuits known in the art may be used.

The gain of variable gain LNA 300 can be adjusted in two ways: by adjusting the source impedance of cascode transistors 122, 124 and/or by adjusting the degeneration inductance seen at the source of input transistor 126. As shown, the gate of cascode transistor 122 is coupled to a first selectable impedance network that includes capacitor 304 connected in series with transistor 308. Similarly, the gate of cascode transistor 124 is coupled to a second selectable impedance network that includes capacitor 306 connected in series with transistor 310. When transistors 308 and 310 are turned on via signal GSW, the gates of cascode transistors 122 and 124 are coupled to ground via capacitors 304 and 306 and inductor 316. In various embodiments, capacitors 304 and 306 and inductor 316 have component values configured to provide a low impedance at the RF operating frequencies of variable gain LNA 300. The network coupled to the gates of cascode transistors 122 and 124 that affects the gain of LNA 300 can also be referred to as a gain selection circuit.

When the gates of cascode transistor 122 and 124 see a low impedance, signals introduced at the sources of cascode transistors 122 and 124 are able to efficiently modulate the gate source voltage of cascode transistors 122 and 124, thereby providing a current gain and isolating the common source stage formed by input transistor 126 from the RF output. On the other hand, when transistors 308 and 310 are turned off via signal GSW, the gates of cascode transistors 122 and 124 see a high impedance. In this condition, signals introduced at the sources of cascode transistors 122 and 124 are coupled to the gate of cascode transistors 122 and 124 via the gate-source capacitance, such that the gate source voltage of cascode transistors 122 and 124 see less of the signal voltage. Accordingly, the gain of cascode transistors 122 and 124 is reduced with respect to the case where the gates are exposed to a low impedance. Therefore, the gain of variable gain LNA 300 is reduced when transistors 308 and 310 are turned off. In some embodiments, the gain and performance of LNA 300 is similar to a non-cascoded common source LNA when transistors 308 and 310 are turned off. In one example, the gain of LNA 300 is 5 dB to 6 dB greater when transistors 308 and 310 are turned on than when transistors 308 and 310 are turned off. Other gain differences may be achieved in alternative embodiments.

In some embodiments, the value of inductor 316 and the value of capacitors 304 and 306 are selected to provide an RF match between the drain of the input transistor 126 and the source of the cascode transistor 124. Thus inductor 206 may also be referred to as a matching inductor. In one example, capacitors 304 and 306 have a capacitance of about 4 pF and inductor 316 has an inductance of between about 200 pH and about 600 pH for circuits having an operating frequency in the range of 5 GHz to 6 GHz. It should be understood that component values and/or operating frequencies outside of this range may also be used depending on the specific circuit and its specifications.

The gain of variable gain LNA 300 can be further varied by bypassing degeneration inductor 320. Since inductors 318 and 320 are mutually coupled using the same orientation, the sum of the inductance of the series combination of mutually coupled inductors 318 and 320 is greater than the sum of their respective inductances. An advantage of using mutually coupled inductors 318 and 320 is the ability to create larger inductances using less silicon area. In various embodiments, the gain of LNA 300 is higher when inductor 320 is bypassed by transistor 132 when signal SEL is high than when inductor 320 is not bypassed when signal SEL is low. In some embodiments, the gain of LNA 300 is about 1 dB higher when inductor 320 is bypassed than when inductor 320 is not bypassed. Bypassing of inductor 320 may lead to the improvement of the distortion performance of LNA 300 by increasing the input third-order intercept point (IIP3) by 2 dB. In alternative embodiments, the effect of bypassing inductor 320 may have a different effect on the gain and IIP3 of LNA 300. Inductors 318 and 320 may have an inductance of between about 50 pH and about 200 pH. Alternatively other inductance values can be used.

In some embodiments, resistors 312, 314 and 324 are connected in series with the gates of transistors 308, 310 and 132, respectively, in order to prevent the parasitic gate-drain and gate source capacitance from decreasing the source or drain impedance of transistors 308, 310 and 132 when transistors 308, 310 and 132 are turned off.

Figure 3B:
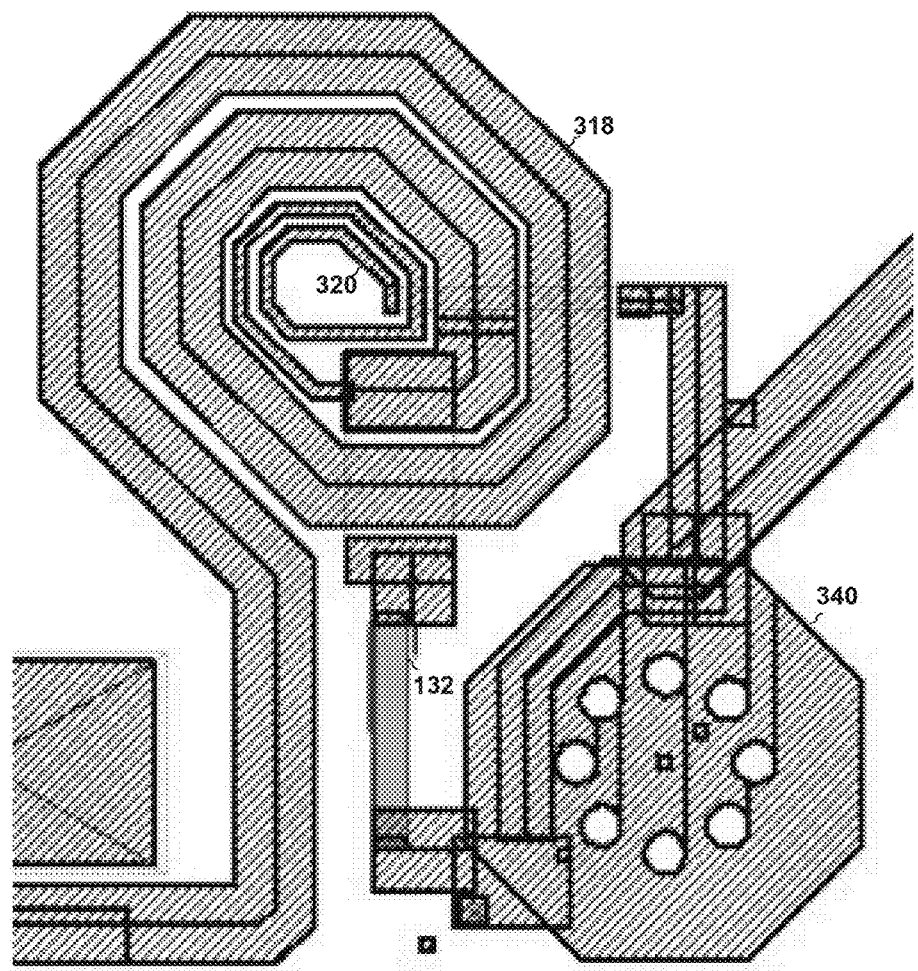
FIG. 3B illustrates a plan view of a semiconductor layout of a portion of the circuit shown in FIG. 3A.

FIG. 3B illustrates a plan view of a layout of inductors 318, 320 and transistor 132 shown in FIG. 3A. As shown, inductors 318 and 320 are implemented using spiral inductors. Mutual coupling between inductors 318 and 320 is achieved by placing the windings of inductor 320 within the circumference of the windings of inductor 318. In some embodiments, both inductors 318 and 320 are implemented using the same conductive layer, such as a metal layer. Alternatively, inductors 318 and 320 may be implemented on different metal layers.

In some embodiment systems that employ LNA 300, the noise performance of LNA 300 is not as critical at lower gains than at higher gains. Thus, inductor 320, which is used in lower gain modes, may have a higher resistance and a lower Q than inductor 318, which is used in both high gain and low gain modes. Accordingly, as shown in the illustrated embodiment, inductor 320 may be constructed using a narrower width of metal than inductor 318, which allows inductor 320 to be implemented using less space than an inductor of a larger width. Also shown in FIG. 3B is pad 340 that is used to provide a ground connection to inductors 320 and 318.

Figure 4A:
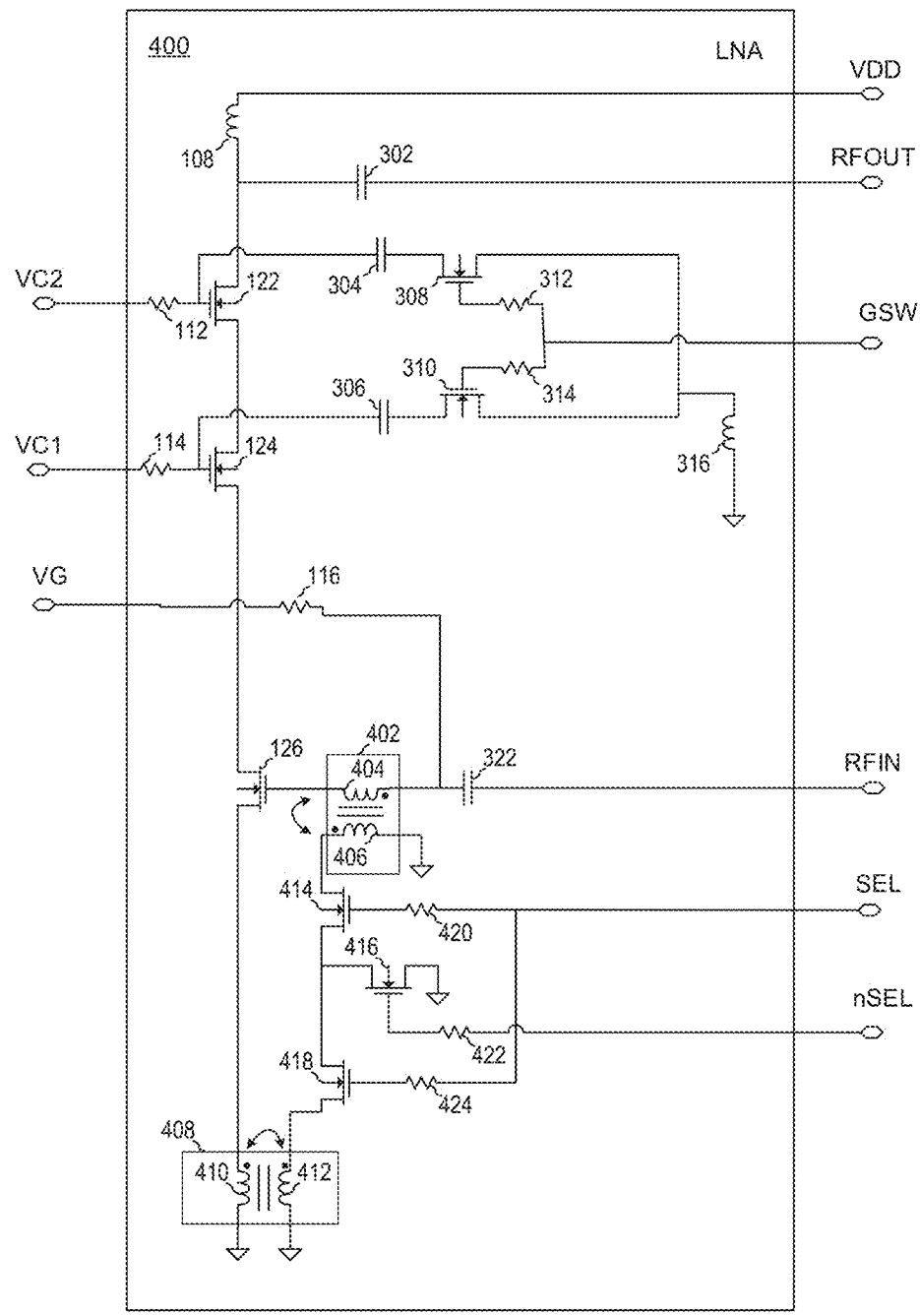
FIG. 4A illustrates a schematic of a further embodiment variable gain LNA.

FIG. 4A illustrates an embodiment variable gain LNA 400, according to a further embodiment of the present invention. The structure of LNA 400 is similar to the structure of LNA 300 shown in FIG. 3A with the exception of the structure of the input inductance and the degeneration inductance. In various embodiments, LNA 400 may be biased using bias generator 230 shown in FIG. 2 and described above. Alternatively, other bias generation circuits known in the art may be used.

As shown, the input inductance of LNA 400 is implemented using winding 404 of first transformer 402 that is coupled to the gate of input transistor 126 and is magnetically coupled to winding 406, and the degeneration inductance of LNA 400 is implemented using winding 410 of second transformer 408 that is coupled to the source of input transistor 126 and is magnetically coupled to winding 412 The current paths of winding 412, transformer 408, and winding 406 are coupled together via a T-switch circuit including transistors 414, 416 and 418 and resistors 420, 422 and 424. During operation, when transistors 414 and 418 are turned-on via signal SEL and transistor 416 is turned-off via signal nSEL, the RF input signal at port RF in is fed-forward to the source of input transistor 126 via first transformer 402 and second transformer 408. Because the orientation of the windings of first transformer 402 coupled to input port RFIN produce a current at winding 406 that is 180 degrees out of phase with the current at winding 404, the resulting current flow through winding 410 of second transformer 408 (which has a positive relationship with the current at winding 412) is positively related to the current flowing into the gate of input transistor 126. This positive current relationship creates an effective inductance coupled to the source of input transistor 126 that is greater than the inductance of winding 410. Thus, the effective gain of LNA 400 is decreased when transistors 414 and 418 are turned-on due to the introduction of negative feedback. In a specific example, this decrease in gain is between about 5 dB and results in an increase of IIP3 about 10 dB. Alternatively, gain differences and linearity improvement outside of this range is also possible depending on the particular system and its specifications.

On the other hand, when transistors 414 and 418 are turned-off via signal SEL and transistor 416 is turned-on via signal nSEL, winding 412 sees a high impedance. Therefore, the inductance coupled to the source of input transistor is decreased compared to the case when transistors 414 and 418 are turned-on. Thus, the effective gain of LNA 400 increases when transistors 414 and 418 are turned-off.

One advantage of using first transformers 402, second transformer 408 and transistors 414, 416 and 418 to provide a variable gain for LNA 400 in the manner illustrated, is that no switches or additional elements are connected to the main current path of input transistor 126 that might degrade the noise performance of LNA 400. Another advantageous aspect includes a reduced parasitic capacitance when transistors 414 and 418 are turned-off, which reduces loading during the higher gain mode.

Figure 4B:
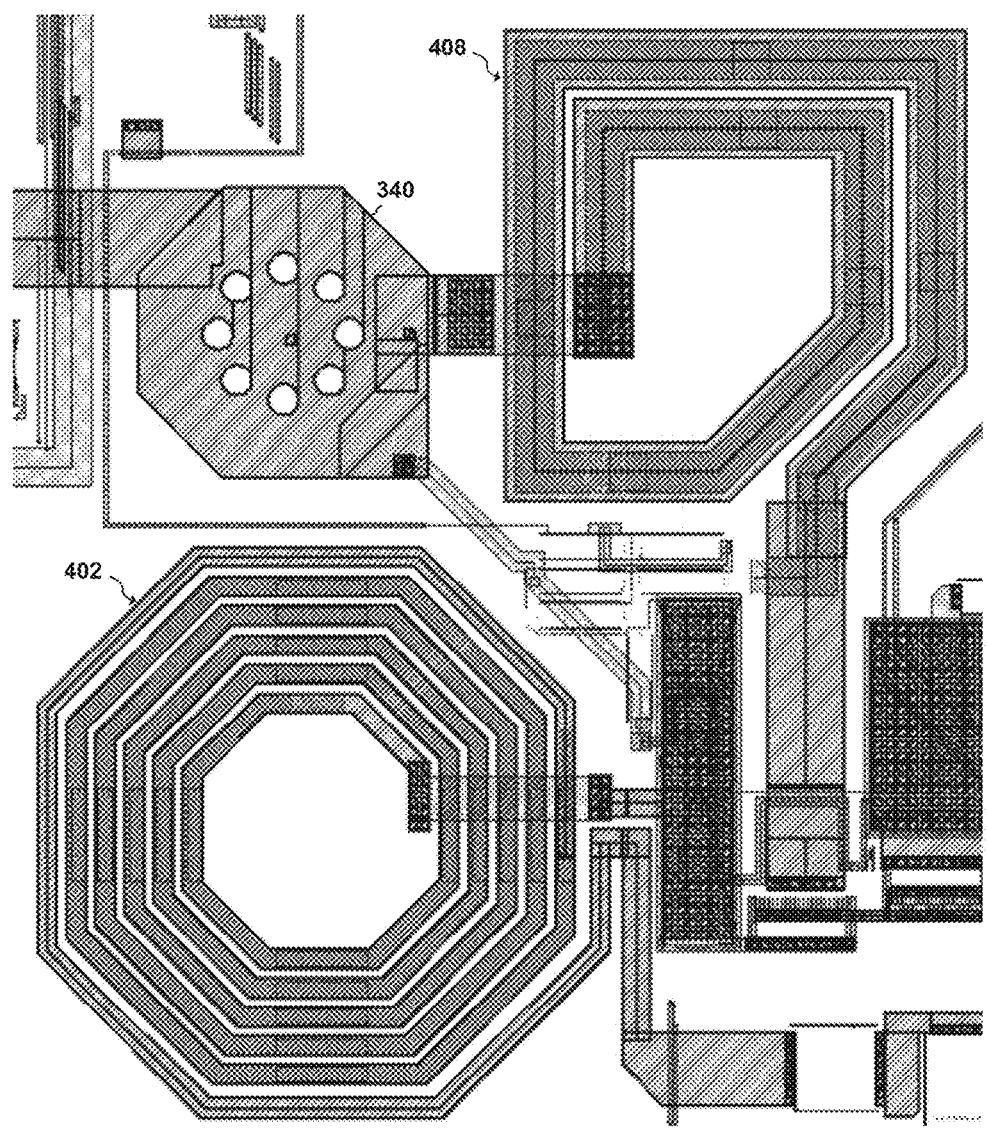
FIG. 4B illustrates a plan view of a semiconductor layout of a portion of the circuit shown in FIG. 4A.

A further advantage of the implementation shown in FIG. 4A is the ability to implement the input and degeneration inductances of LNA 400 in a compact manner. An example of this is shown in FIG. 4B, which illustrates a plan view of a layout of first transformer 402 and second transformer 408. As shown, both first transformer 402 and second transformer 408 are implemented using spiral inductor structures in which the layers of each winding are disposed on top of each other. In one example, winding 410 (connected to the source of input transistor 126) of second transformer 408 is disposed on a top layer of metal and winding 412 is disposed on a lower layer of metal underneath winding 410; and winding 404 (connected to the gate of input transistor 126) of first transformer 402 is disposed on the top layer of metal, and winding 406 is disposed on a lower layer of metal underneath winding 404. It should be understood that the layout shown in FIG. 4B is just one example of many possible ways the layout of transformers 402 and 408 may be implemented.

Figures 5, 6:
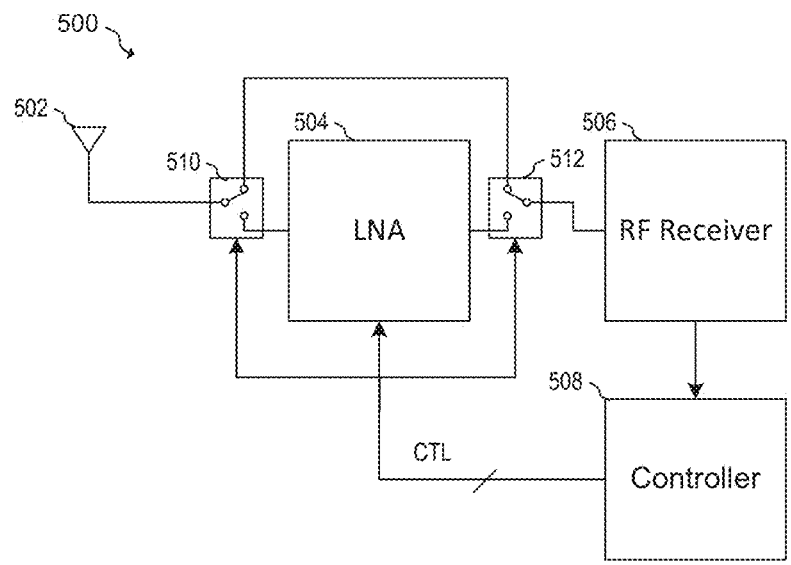
FIG. 5 illustrates an embodiment RF system that utilizes an embodiment LNA.
FIG. 6 illustrates a table summarizing bias settings with respect to power supply voltage and gain settings.

FIG. 5 illustrates an RF system 500 including LNA 504 that may be implemented using embodiment LNA circuits and bias generators described above. For example, LNA 504 may be implemented using RF circuit 200 shown in FIG. 2, LNA 300 shown in FIG. 3A or LNA 400 shown in FIG. 4A. LNA 504 is coupled between antenna 502 and RF receiver 506. In situations where RF signals received by antenna 502 are weak, controller 508 may configure bypass switches 510 and 512 to allow the signal path to pass through LNA 504 and set LNA 504 at a high gain setting. As the power received by antenna 502 increases, controller 508 may decrease the gain of LNA 504 by selecting lower gain setting using signals GSW and SEL as described above. In cases where the RF signals received by antenna 502 are very strong, controller 508 may configure bypass switches 510 and 512 to allow the signal path to bypass LNA 504. In embodiments where LNA 504 utilizes bias generator 230 shown in FIG. 2, controller 508 may configure switch 234 to apply bypass voltage VPS to the gate of input transistor 126 as described above.

In various embodiments, the various disclosed LNAs including RF circuit 200 shown in FIG. 2, LNA 300 shown in FIG. 3A and LNA 400 shown in FIG. 4A may be configured to operate over a wide variety of RF operating frequencies, for example, between about 5 GHz and about 6 GHz. Frequencies outside of this range may also be used, for example, 100 MHz to 24 GHz. In such embodiments, the various component values of the embodiment LNA circuits may be adjusted using methods known in the art to provide operation at the desired or specified frequency of operation.

FIG. 6 illustrates a table summarizing bias settings with respect to power supply voltage and gain settings that may be used with embodiment variable gain LNAs, such as RF circuit 200 shown in FIG. 2, LNA 300 shown in FIG. 3A, and LNA 400 shown in FIG. 4A. For example, at low power supply voltages when the voltage at power supply VDD is less than a threshold voltage VDDL, voltages Vds1, Vds3, Vds3 and Vds6 are produced by DAC 250 in a high gain mode, a first low gain mode, a second low gain mode and a third low gain mode, respectively. When the voltage at power supply VDD is between threshold VDDL and VDDH, voltages Vds2, Vds4, Vds4 and Vds7 are produced by DAC 250 in the high gain mode, the first low gain mode, the second low gain mode and the third low gain mode, respectively. When the voltage at power supply VDD is greater than VDDH, voltages Vds2, Vds5, Vds5 and Vds7 are produced by DAC 250 in the high gain mode, the first low gain mode, the second low gain mode and the third low gain mode, respectively. Generally, as the gain of the embodiment LNA is decreased, the voltage across input transistor 126 is increased for increased linearity at lower gains. In one specific example, voltages Vds1, Vds2, Vds3, Vds4, Vds5, Vds6 and Vds7 may range between about 0.4 v and about IV where Vds1≤Vds2≤Vds3≤Vds4≤Vds5≤Vds6≤Vds7. Alternatively, other voltage ranged may be used. In some embodiments, the high gain mode is implemented when signal GSW is high, SEL is low and nSEL is high, the first low gain mode is implemented when GSW is high, SEL is high and nSEL is low, the second low gain mode is implemented when GSW is low, SEL is low and nSEL is high and the third low gain mode is implemented when GSW is low, SEL is high and nSEL is low. It should be understood that the relationship between drain-source voltage of transistor 126, VDD and gain mode shown by the table in FIG. 6 is just one example of many possible embodiment examples.

Figure 7:
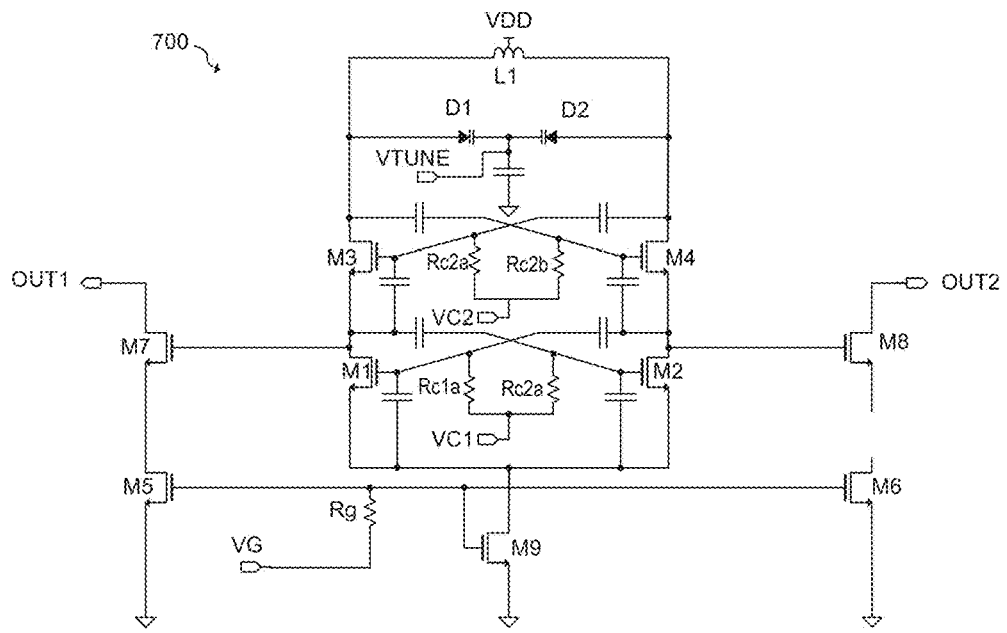
FIG. 7 illustrates an embodiment VCO.

FIG. 7 illustrates a voltage controlled oscillator (VCO) 700 that can be biased using embodiment bias generation systems and methods described herein. As shown, VCO 700 includes a first cross-coupled NMOS pair that includes NMOS transistors M1 and M2, a second cross-coupled NMOS pair that includes NMOS transistors M3 and M4, an inductor L1 having a center tap coupled to VDD, and varactor diodes D1 and D2 that have a capacitance related to a voltage at tuning input VTUNE. The output of VCO is buffered by output NMOS transistors M7 and M8. Current source NMOS transistor M9 provides a bias current to the first and second cross-coupled NMOS pairs, and current source NMOS transistors M5 and M6 provide bias current to output transistors M7 and M8, respectively.

In an embodiment, VCO 700 is biased by an embodiment bias generator such as bias generator 230 shown in FIG. 2. As shown, bias voltage VG is coupled to the gates of NMOS current source transistors M5, M6 and M9 via resistor Rg; bias voltage VC1 is coupled to the gate of NMOS transistor M1 via resistor Rc1a and to the gate of NMOS transistors M2 via resistor Rc1b; and bias voltage VC2 is coupled to the gate of NMOS transistor M3 via resistor Rc2a and to the gate of NMOS transistor M4 via resistor Rc2b. In some embodiments, cross-coupled transistors M3 and M4 may be omitted in which case the corresponding embodiment bias generator would omit level shifter 120 and second cascode transistor 122. It should be understood that VCO 700 is just one example of many possible VCO circuits that could be biased using embodiment bias generation circuits described herein.

Figure 8:
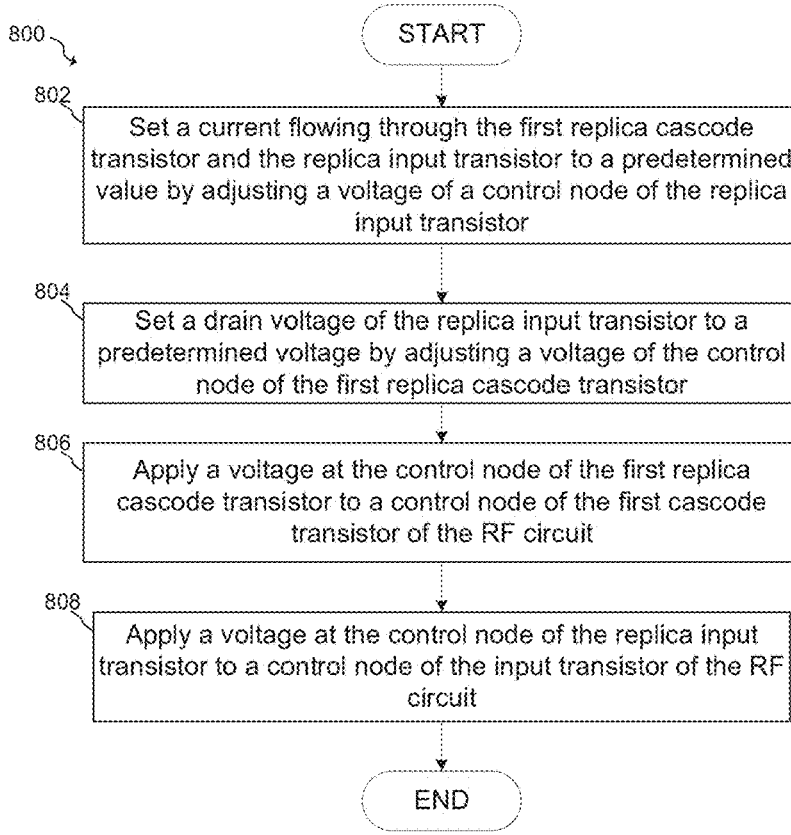
FIG. 8 illustrates an embodiment method.

FIG. 8 illustrates a block diagram of a method 800 of biasing an RF circuit that includes an input transistor coupled in series with a first cascode transistor using a biasing circuit including a replica input transistor coupled in series with a first replica cascode transistor. In some embodiments, bias generator 230 can be used to implement method 800. In step 802, a current flow is set through the first replica cascode transistor and the replica input transistor to a predetermined value by adjusting a voltage of a control node of the replica input transistor. In step 804, a drain voltage of the replica input transistor is set to a predetermined voltage by adjusting a voltage of the control node of the first replica cascode transistor, and in step 806, a voltage at the control node of the first replica cascode transistor is applied to a control node of the first cascode transistor of the RF circuit.

A voltage at the control node of the replica input transistor is applied to a control node of the input transistor of the RF circuit in step 808.

Example embodiments of the present invention are summarized here. Other embodiments can also be understood from the entirety of the specification and the claims filed herein.

Example 1

A circuit including: a replica input transistor comprising a control node configured to be coupled to a control node of an input transistor of an RF circuit; a first replica cascode transistor coupled in series with the replica input transistor, the first replica cascode transistor including a control node configured to be coupled to a control node of a first cascode transistor of the RF circuit; an active current source circuit having a first output coupled to the control node of the replica input transistor, the active current source circuit configured to set a current flowing through the first replica cascode transistor and the replica input transistor to a predetermined value by adjusting a voltage of the control node of the replica input transistor; and an active cascode biasing circuit including a first output coupled to the control node of the first replica cascode transistor, the active cascode biasing circuit configured to set a drain voltage of the replica input transistor to a predetermined voltage by adjusting a voltage of the control node of the first replica cascode transistor.

Example 2

The circuit of example 1, further including the RF circuit that includes the input transistor and the first cascode transistor.

Example 3

The circuit of one of examples 1 or 2, wherein the RF circuit is a low noise amplifier circuit.

Example 4

The circuit of one of examples 1-3, further including a second replica cascode transistor coupled in series with the first replica cascode transistor. The second replica cascode transistor includes a control node configured to be coupled to a control node of a second cascode transistor of the RF circuit, and the active cascode biasing circuit further includes a second output coupled to the control node of the second replica cascode transistor.

Example 5

The circuit of example 4, wherein the active cascode biasing circuit includes a level shifting circuit coupled between the first output and the second output of the active cascode biasing circuit.

Example 6

The circuit of one of examples 1-5, wherein the active current source circuit includes: a reference current source; a first resistor coupled between a reference voltage node and the reference current source at a first node; a second resistor coupled between a drain of the first cascode transistor and the reference voltage node; and a first amplifier having a first input coupled to the first node, a second input coupled to the drain of the first cascode transistor and an output coupled to the control node of the replica input transistor.

Example 7

The circuit of one of examples 1-6, wherein the active cascode biasing circuit includes a second amplifier having a first input coupled to a drain of the replica input transistor, a second input coupled to a bias reference voltage node, and an output coupled to the control node of the first replica cascode transistor.

Example 8

The circuit of example 7, further including a digital-to-analog converter having an output coupled to the bias reference voltage node.

Example 9

An RF circuit having an input transistor coupled in series with a first cascode transistor using a biasing circuit including a replica input transistor coupled in series with a first replica cascode transistor. A method of biasing the RF circuit includes: setting a current flowing through the first replica cascode transistor and the replica input transistor to a predetermined value by adjusting a voltage of a control node of the replica input transistor; setting a drain voltage of the replica input transistor to a predetermined voltage by adjusting a voltage of the control node of the first replica cascode transistor; applying a voltage at the control node of the first replica cascode transistor to a control node of the first cascode transistor of the RF circuit; and applying a voltage at the control node of the replica input transistor to a control node of the input transistor of the RF circuit.

Example 10

The method of example 9, where setting the current flowing through the first replica cascode transistor and the replica input transistor includes: measuring a voltage difference between a first voltage across a first resistor coupled between a reference current source and a reference voltage node, and a second voltage across a second resistor coupled between a drain of the first replica cascode transistor and the reference voltage node; amplifying the measured voltage difference using an amplifier; and applying the amplified measured voltage difference to the control node of the replica input transistor.

Example 11

The method of example 10, further comprising: lowpass filtering a power supply voltage; and applying the lowpass filtered power supply voltage to the reference voltage node.

Example 12

The method of examples 9-11, where setting the drain voltage of the replica input transistor to the predetermined voltage includes: measuring a voltage difference between a voltage at a bias reference voltage node and the drain voltage of the replica input transistor; amplifying the measured voltage difference using an amplifier; and applying the amplified measured voltage difference to the control node of the first replica cascode transistor.

Example 13

The method of example 12, further including generating a voltage at the bias reference voltage node using a digital-to-analog converter.

Example 14

The method of one of examples 12 or 13, where: the RF circuit further includes a second cascode transistor coupled in series with the first cascode transistor, and the biasing circuit further includes a second replica cascode transistor coupled in series with the replica input transistor; and the method further includes level shifting the voltage of the control node of the first replica cascode transistor, and applying the level shifted voltage to a control node of the second replica cascode transistor and to a control node of the second cascode transistor.

Example 15

A circuit includes: an RF circuit and a bias circuit. The RF circuit includes a first cascode transistor, an input transistor coupled in series with the first cascode transistor, an inductive degeneration circuit coupled between a load path of the input transistor and a ground node, and an inductive pullup circuit coupled between a load path of the first cascode transistor and a power supply node. The bias circuit includes: a first replica cascode transistor having a control node coupled to a control node of the first cascode transistor; a replica input transistor coupled in series with the first replica cascode transistor, where a control node of the replica input transistor is coupled to a control node of the input transistor of the RF circuit; a replica degeneration circuit coupled between a load path of the replica input transistor and the ground node; a first resistor having a first terminal coupled to the power supply node and a second terminal coupled to a reference current node; a second resistor coupled between the power supply node and the first replica cascode transistor; a first amplifier having a first input coupled to the reference current node, a second input coupled to the second terminal of the first resistor, and an output coupled to a control node of the first replica input transistor; and a second amplifier having a first input coupled to a bias reference voltage node, a second input coupled to a drain of the replica input transistor and an output coupled to the control node of the first replica cascode transistor.

Example 16

The circuit of example 15, where: the RF circuit further includes a second cascode transistor coupled between the first cascode transistor and the inductive pullup circuit; the bias circuit further includes a second replica cascode transistor coupled between the first replica cascode transistor and the second resistor, where a control node of the second replica cascode transistor is coupled to a control node of the second cascode transistor; and a level shifting circuit coupled between the output of the second amplifier and the control node of the second replica cascode transistor.

Example 17

The circuit of one of examples 15 or 16, further including a lowpass filter coupled between the inductive pullup circuit and the first and second resistors.

Example 18

The circuit of one of examples 15-17, where the inductive degeneration circuit of the RF circuit includes a selectable inductor; the replica degeneration circuit of the bias circuit includes a selectable resistor; and a resistance of the selectable resistor and a resistance of the selectable inductor have a same temperature coefficient.

Example 19

The circuit of one of examples 15-18, where the RF circuit is low noise amplifier.

Example 20

The circuit of example 19, where the RF circuit further includes a first selectable impedance network coupled between the control node of the first cascode transistor and the ground node; the first selectable impedance network includes a capacitor, a first switching transistor and a matching inductor coupled in series; and the RF circuit has a first gain when the first switching transistor is on and a second gain when the first switching transistor is off, and the first gain is greater than the second gain.

Example 21

The circuit of example 20, where the matching inductor includes an inductance that provides an RF match between a drain of the input transistor and a source of the first cascode transistor.

Example 22

The circuit of one of examples 19-21, where the RF circuit further includes: a first transformer having a first winding coupled between an RF input port and a control node of the input transistor, and a second winding coupled between the ground node and a first load path terminal of a second switching transistor; and a second transformer having a first winding coupled between the ground node and a second load path terminal of the second switching transistor and a second winding coupled between the ground node and a source of the input transistor, where the inductive degeneration circuit includes the second winding of the second transformer, the RF circuit has a first gain when the second switching transistor is on and a second gain when the second switching transistor is off, and the first gain is less than the second gain.

Example 23

The circuit of example 15, where the RF circuit is voltage controlled oscillator.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A circuit comprising:
   a replica input transistor comprising a first control node configured to be coupled to a second control node of an input transistor of an RF circuit;
   a first replica cascode transistor coupled in series with the replica input transistor, the first replica cascode transistor comprising a third control node configured to be coupled to a fourth control node of a first cascode transistor of the RF circuit;
   an active current source circuit having a first output coupled to the first control node of the replica input transistor, the active current source circuit configured to set a current flowing through the first replica cascode transistor and the replica input transistor to a predetermined value by adjusting a voltage of the first control node of the replica input transistor; and
   an active cascode biasing circuit comprising a first output coupled to the third control node of the first replica cascode transistor, the active cascode biasing circuit configured to set a drain voltage of the replica input transistor to a predetermined voltage by adjusting a voltage of the third control node of the first replica cascode transistor, wherein the active cascode biasing circuit comprises a second amplifier having a first input coupled to a drain of the replica input transistor, a second input coupled to a bias reference voltage node, and an output coupled to the third control node of the first replica cascode transistor.

2. The circuit of claim 1, further including the RF circuit comprising the input transistor and the first cascode transistor.

3. The circuit of claim 2, wherein the RF circuit is a low noise amplifier circuit.

4. The circuit of claim 1, further comprising a second replica cascode transistor coupled in series with the first replica cascode transistor, the second replica cascode transistor comprising a fifth control node configured to be coupled to a sixth control node of a second cascode transistor of the RF circuit, wherein the active cascode biasing circuit further comprises a second output coupled to the fifth control node of the second replica cascode transistor.

5. The circuit of claim 4, wherein the active cascode biasing circuit comprises a level shifting circuit coupled between the first output and the second output of the active cascode biasing circuit.

6. The circuit of claim 1, wherein the active current source circuit comprises:
   a reference current source;
   a first resistor coupled between a reference voltage node and the reference current source at a first node;
   a second resistor coupled between a drain of the first cascode transistor and the reference voltage node; and
   a first amplifier having a first input coupled to the first node, a second input coupled to the drain of the first cascode transistor and an output coupled to the first control node of the replica input transistor.

7. The circuit of claim 1, further comprising a digital-to-analog converter having an output coupled to the bias reference voltage node.

8. A method of biasing an RF circuit comprising an input transistor coupled in series with a first cascode transistor using a biasing circuit comprising a replica input transistor coupled in series with a first replica cascode transistor, the method comprising:
   setting a current flowing through the first replica cascode transistor and the replica input transistor to a predetermined value by adjusting a voltage of a first control node of the replica input transistor;
   setting a drain voltage of the replica input transistor to a predetermined voltage by adjusting a voltage of a second control node of the first replica cascode transistor;
   applying a voltage at the second control node of the first replica cascode transistor to a third control node of the first cascode transistor of the RF circuit; and
   applying a voltage at the first control node of the replica input transistor to a third control node of the input transistor of the RF circuit, wherein setting the drain voltage of the replica input transistor to the predetermined voltage comprises
      measuring a voltage difference between a voltage at a bias reference voltage node and the drain voltage of the replica input transistor,
      amplifying the measured voltage difference using an amplifier, and
      applying the amplified measured voltage difference to the second control node of the first replica cascode transistor.

9. The method of claim 8, wherein setting the current flowing through the first replica cascode transistor and the replica input transistor comprises:
   measuring a voltage difference between a first voltage across a first resistor coupled between a reference current source and a reference voltage node, and a second voltage across a second resistor coupled between a drain of the first replica cascode transistor and the reference voltage node;
   amplifying the measured voltage difference using an amplifier; and
   applying the amplified measured voltage difference to the first control node of the replica input transistor.

10. The method of claim 9, further comprising:
    lowpass filtering a power supply voltage; and
    applying the lowpass filtered power supply voltage to the reference voltage node.

11. The method of claim 8, further comprising generating a voltage at the bias reference voltage node using a digital-to-analog converter.

12. The method of claim 8, wherein:
    the RF circuit further comprises a second cascode transistor coupled in series with the first cascode transistor, and the biasing circuit further comprises a second replica cascode transistor coupled in series with the replica input transistor; and
    the method further comprises level shifting the voltage of the second control node of the first replica cascode transistor, and applying the level shifted voltage to a fourth control node of the second replica cascode transistor and to a fifth control node of the second cascode transistor.

13. A circuit comprising:
    an RF circuit comprising
       a first cascode transistor,
       an input transistor coupled in series with the first cascode transistor,
       an inductive degeneration circuit coupled between a first load path of the input transistor and a ground node, and
       an inductive pullup circuit coupled between a second load path of the first cascode transistor and a power supply node; and a bias circuit comprising
a first replica cascode transistor having a first control node coupled to a second control node of the first cascode transistor,
a replica input transistor coupled in series with the first replica cascode transistor, wherein a third control node of the replica input transistor is coupled to a fourth control node of the input transistor of the RF circuit,
a replica degeneration circuit coupled between a third load path of the replica input transistor and the ground node,
a first resistor having a first terminal coupled to the power supply node and a second terminal coupled to a reference current node,
a second resistor having a first terminal coupled to the power supply node and a second terminal coupled to the first replica cascode transistor,
a first amplifier having a first input coupled to the reference current node, a second input coupled to the second terminal of the second resistor, and an output coupled to a fifth control node of the first replica input transistor, and
a second amplifier having a first input coupled to a bias reference voltage node, a second input coupled to a load path terminal of the replica input transistor that is coupled to the first replica cascode transistor and an output coupled to the first control node of the first replica cascode transistor.

14. The circuit of claim 13, wherein:
the RF circuit further comprises a second cascode transistor coupled between the first cascode transistor and the inductive pullup circuit;
the bias circuit further comprises a second replica cascode transistor coupled between the first replica cascode transistor and the second resistor, wherein a sixth control node of the second replica cascode transistor is coupled to a seventh control node of the second cascode transistor; and
a level shifting circuit coupled between the output of the second amplifier and the sixth control node of the second replica cascode transistor.

15. The circuit of claim 13, further comprising a lowpass filter coupled between the inductive pullup circuit and the first and second resistors.

16. The circuit of claim 13, wherein:
the inductive degeneration circuit of the RF circuit comprises a selectable inductor; and
the replica degeneration circuit of the bias circuit comprises a selectable resistor, wherein a resistance of the selectable resistor and a resistance of the selectable inductor have a same temperature coefficient.

17. The circuit of claim 13, wherein the RF circuit is low noise amplifier.

18. The circuit of claim 17, wherein the RF circuit further comprises a first selectable impedance network coupled between the second control node of the first cascode transistor and the ground node, the first selectable impedance network comprising a capacitor, a first switching transistor and a matching inductor coupled in series, wherein the RF circuit has a first gain when the first switching transistor is on and a second gain when the first switching transistor is off, and the first gain is greater than the second gain.

19. The circuit of claim 18, wherein the matching inductor comprises an inductance that provides an RF match between a drain of the input transistor and a source of the first cascode transistor.

20. The circuit of claim 17, wherein the RF circuit further comprises:
a first transformer having a first winding coupled between an RF input port and the fourth control node of the input transistor, and a second winding coupled between the ground node and a first load path terminal of a second switching transistor; and
a second transformer having a first winding coupled between the ground node and a second load path terminal of the second switching transistor and a second winding coupled between the ground node and a source of the input transistor, wherein the inductive degeneration circuit comprises the second winding of the second transformer, the RF circuit has a first gain when the second switching transistor is on and a second gain when the second switching transistor is off, and the first gain is less than the second gain.

21. The circuit of claim 13, wherein the RF circuit is voltage controlled oscillator.

22. A circuit comprising:
a replica input transistor comprising a first control node configured to be coupled to a second control node of an input transistor of an RF circuit;
a first replica cascode transistor coupled in series with the replica input transistor, the first replica cascode transistor comprising a third control node configured to be coupled to a fourth control node of a first cascode transistor of the RF circuit;
an active current source circuit having a first output coupled to the first control node of the replica input transistor, the active current source circuit configured to set a current flowing through the first replica cascode transistor and the replica input transistor to a predetermined value by adjusting a voltage of the first control node of the replica input transistor;
an active cascode biasing circuit comprising a first output coupled to the third control node of the first replica cascode transistor, the active cascode biasing circuit configured to set a drain voltage of the replica input transistor to a predetermined voltage by adjusting a voltage of the third control node of the first replica cascode transistor; and
a second replica cascode transistor coupled in series with the first replica cascode transistor, the second replica cascode transistor comprising a fifth control node configured to be coupled to a sixth control node of a second cascode transistor of the RF circuit, wherein the active cascode biasing circuit further comprises a second output coupled to the fifth control node of the second replica cascode transistor, wherein the active cascode biasing circuit comprises a level shifting circuit coupled between the first output and the second output of the active cascode biasing circuit.

23. A circuit comprising:
a replica input transistor comprising a first control node configured to be coupled to a second control node of an input transistor of an RF circuit;
a first replica cascode transistor coupled in series with the replica input transistor, the first replica cascode transistor comprising a third control node configured to be coupled to a fourth control node of a first cascode transistor of the RF circuit;
an active current source circuit having a first output coupled to the first control node of the replica input transistor, the active current source circuit configured to set a current flowing through the first replica cascode transistor and the replica input transistor to a predetermined value by adjusting a voltage of the first control node of the replica input transistor, wherein the active current source circuit comprises
a reference current source,
a first resistor coupled between a reference voltage node and the reference current source at a first node,
a second resistor coupled between a drain of the first cascode transistor and the reference voltage node, and
a first amplifier having a first input coupled to the first node, a second input coupled to the drain of the first cascode transistor and an output coupled to the first control node of the replica input transistor; and an active cascode biasing circuit comprising a first output coupled to the third control node of the first replica cascode transistor, the active cascode biasing circuit configured to set a drain voltage of the replica input transistor to a predetermined voltage by adjusting a voltage of the third control node of the first replica cascode transistor.

\* \* \* \* \*